US005496679A

United States Patent [19]

Hauquier et al.

[11] Patent Number: 5,496,679

[45] Date of Patent: Mar. 5, 1996

[54] IMAGING ELEMENT AND METHOD FOR MAKING LITHOGRAPHIC PRINTING PLATES ACCORDING TO THE SILVER SALT DIFFUSION TRANSFER PROCESS

[75] Inventors: Guido Hauquier, Nijlen; Willem Cortens, Booischot; Paul Coppens, Turnhout; Ludovicus Vervloet, Kassel, all of Belgium

[73] Assignee: AGFA-Gevaert, N.V., Mortsel, Belgium

[21] Appl. No.: 408,184

[22] Filed: Mar. 22, 1995

Related U.S. Application Data

[63] Continuation of Ser. No. 253,262, Jun. 2, 1994, abandoned.

[30] Foreign Application Priority Data

Jun. 28, 1993 [EP] European Pat. Off. .............. 93201878

[51] Int. Cl.$^{6}$ .............................. G03G 8/52; G03G 8/28; G03F 7/07

[52] U.S. Cl. .......................... 430/204; 430/227; 430/232; 430/248

[58] Field of Search .................................... 430/204, 227, 430/232, 248

[56] References Cited

U.S. PATENT DOCUMENTS

| | | | |
|---|---|---|---|
| 3,706,568 | 12/1972 | Haefner | 430/227 |
| 3,971,660 | 7/1976 | Staehle | 430/204 |
| 4,330,605 | 5/1982 | Boston | 430/204 |
| 4,429,032 | 1/1984 | Matthe et al. | 430/227 |
| 5,194,347 | 3/1993 | Vermeulen et al. | 430/227 |
| 5,196,290 | 3/1993 | Coppens et al. | 430/204 |
| 5,283,156 | 2/1994 | Monbaliu et al. | 430/204 |

FOREIGN PATENT DOCUMENTS

| | | | |
|---|---|---|---|
| 1419511 | 1/1973 | United Kingdom | 430/204 |

*Primary Examiner*—Richard L. Schilling
*Attorney, Agent, or Firm*—Breiner & Breiner

[57] ABSTRACT

The present invention provides an imaging element comprising on a flexible hydrophobic support (i) a hardened hydrophilic layer, containing a hydrophilic synthetic homocopolymer or copolymer and being hardened with a hydrolyzed tetraalkyl orthosilicate crosslinking agent, (ii) a receiving layer containing physical development nuclei contiguous to said hydrophilic layer, (iii) an intermediate layer comprising a non-proteinic hydrophilic film-forming polymer or hydrophobic polymer beads having an average diameter not lower than 0.2 μm and having been prepared by polymerization of a ethylenically unsaturated monomer and (iv) a photosensitive layer containing a silver halide emulsion being in water permeable relationship with said receiving layer. The invention also relates to a method for making lithographic plates with said imaging element.

9 Claims, No Drawings

IMAGING ELEMENT AND METHOD FOR MAKING LITHOGRAPHIC PRINTING PLATES ACCORDING TO THE SILVER SALT DIFFUSION TRANSFER PROCESS

This is a continuation of application Ser. No. 08/253,262 filed Jun. 2, 1994, now abandoned.

1. FIELD OF THE INVENTION

The present invention relates to an imaging element for making improved lithographic printing plates according to the silver salt diffusion transfer process. Furthermore the present invention relates to a method for making improved lithographic printing plates with said imaging element.

2. BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed e.g. EP-A-423399 and EP-A-410500.

The DTR-image can be formed in the image-receiving layer of a sheet or web material which is a separate element with respect to the photographic silver halide emulsion material (a so-called two-sheet DTR-element) or in the image-receiving layer of a so-called single-support element, also called-mono-sheet element, which contains at least one photographic silver halide emulsion layer integral with an image-receiving layer in waterpermeable relationship therewith. It is the latter mono-sheet version which is preferred for the preparation of offset printing plates by the DTR method.

According to the preferred embodiment of the mono-sheet DTR-offset printing plate, disclosed in e.g. U.S. Pat. No. 4,722,535 and GB-P-1,241,661, a flexible support e.g. paper or an organic resin is provided in the order given with a silver halide emulsion layer and a layer containing physical development nuclei serving as the image-receiving layer. After information-wise exposure and development the imaged element is used as a printing plate without the removal of the now-useless emulsion layers.

Offset printing plates with a flexible support are preferred in short-run jobs over plates with an aluminium support because plates with a flexible support are less expensive. Furthermore, when the flexible support is also transparent e.g. an organic resin such as polyethylene terephtalate an exposure through the back is possible.

When using said type of mono-sheet DTR offset printing plate it has been found that the visual inspection of the printing plate is difficult because the printing areas have a shining metallic outlook, whereas the non-printing areas are black. Furthermore these printing plates are not compatible with other types of printing plates in regard to dampening solutions and printing inks, what is cumbersome for the printer. As for other printing plates it is required that the mono-sheet DTR offset printing plates have good ink acceptance in the printing areas and no ink acceptance in the non-printing areas (no staining). It is furthermore desirable that the number of copies that have to be disposed off because of ink acceptance in the non-printing areas (so called toning) during start-up of the printing process is limited.

3. SUMMARY OF THE INVENTION

It is an object of the present invention to provide a method for making a lithographic printing plate having a flexible support according to the DTR-process which is not suffering from the above mentioned disadvantages.

It is another object of the present invention to provide a method for making a lithographic printing plate according to the DTR-process having good printing properties i.e. good ink acceptance in the printing areas, no ink acceptance in the non-printing areas and a low number of copies that have to be disposed off during start-up of the printing process.

It is still another object of the present invention to provide a method for making a lithographic printing plate according to the DTR-process that has a better compatibility with other printing plates used in the printing process.

Further objects of the present invention will become clear from the description hereinafter.

According to the present invention there is provided an imaging element comprising on a flexible hydrophobic support (i) a hardened hydrophilic layer, containing a hydrophilic synthetic homocopolymer or copolymer and being hardened with a hydrolyzed tetraalkyl orthosilicate crosslinking agent, (ii) a receiving layer containing physical development nuclei contiguous to said hydrophilic layer, (iii) an intermediate layer contiguous to said receiving layer comprising a non-proteinic hydrophilic film-forming polymer or hydrophobic polymer beads having an average diameter not lower than 0.2 μm and having been prepared by polymerization of a ethylenically unsaturated monomer and (iv) a photosensitive layer containing a silver halide emulsion being in water permeable relationship with said receiving layer.

According to the present invention there is also provided an improved method for making a lithographic printing plate according to the silver salt diffusion transfer process comprising the steps of:

(a) image-wise exposing an imaging element comprising on a flexible hydrophobic support (i) a hardened hydrophilic layer, containing a hydrophilic synthetic homocopolymer or copolymer and being hardened with a hydrolyzed tetraalkyl orthosilicate crosslinking agent and (ii) a receiving layer containing physical development nuclei contiguous to said hydrophilic layer and (iii) a photosensitive layer containing a silver halide emulsion being in water permeable relationship with said receiving layer, (b) applying an aqueous alkaline solution to the imaging element in the presence of (a) developing agent(s) and (a) silver halide solvent(s) to form a silver image and to allow unreduced silver halide or complexes formed thereof to diffuse image-wise from the photosensitive layer to said receiving layer to produce therein a silver image, (c) washing the imaging element to remove the photosensitive layer, thereby exposing said silver image formed in said receiving layer.

4. DETAILED DESCRIPTION OF THE INVENTION

According to the present invention it has been found that a lithographic printing plate prepared according to the DTR-process by exposing an imaging element comprising on a flexible hydrophobic support a hardened hydrophilic layer, a receiving layer and a photosensitive layer containing a silver halide emulsion, processing said imaging element and removing the photosensitive layer, thereby exposing the silver image formed in said receiving layer is convenient for visual inspection ,has good printing properties i.e. good ink acceptance in the printing areas, no ink acceptance in the non-printing areas and a low number of copies that have to be disposed off during start-up of the printing process and a good compatibility with dampening solutions and printing inks commonly used in the art.

The imaging element is preferably prepared by the following steps:

coating on a flexible hydrophobic support a hardened hydrophilic layer, containing a hydrophilic synthetic homopolymer or copolymer and being hardened with a hydrolyzed tetraalkyl orthosilicate crosslinking agent, coating on the hardened hydrophilic layer a receiving layer containing physical development nuclei, coating on the hardened hydrophilic layer an intermediate layer comprising a non-proteinic hydrophilic film-forming polymer or hydrophobic polymer beads having an average diameter not lower than 0.2 μm and having been prepared by polymerization of a ethylenically unsaturated monomer and coating on the receiving layer a photosensitive layer containing a silver halide emulsion being in water permeable relationship with said receiving layer.

The imaging element can also be prepared by laminating said photosensitive layer with said intermediate layer onto the receiving layer by the steps of:

coating on a temporary base, preferably a cellulose triacetate or polyethylene terephtalate film base said photosensitive layer, coating on the photosensitive layer said intermediate layer, pressing the thus formed photosensitive layer packet with its side carrying said intermediate layer against said receiving layer, which has been wet with an aqueous moistening liquid that may comprise additives, removing said temporary base to leave a photosensitive monosheet layer assemblage on a flexible support and optionally drying said photosensitive monosheet layer assemblage on a flexible support.

This sequence of steps may be altered in the sense that said temporary base is not removed before the photo-exposure step. The photo-exposure of the sandwich is then performed through said temporary base, which for this embodiment obviously is a transparent film base and then the temporary base is removed. Thanks to the presence of the temporary base the silver halide emulsion layer(s) find themselves protected from mechanical deformation, especially in wet condition.

When preparing an imaging element for making lithographic printing plates in accordance with the methods described in the present invention the intermediate layer comprising a non-proteinic hydrophilic film-forming polymer or hydrophobic polymer beads having an average diameter not lower than 0.2 μm and having been prepared by polymerization of a ethylenically unsaturated monomer can be omissed.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly(ethylene terephthalate) film, polycarbonate film, polyvinylchloride film or poly-Alpha-olefin films such as polyethylene or polypropylene film.

One or more subbing layers may be coated between the flexible hydrophobic support and the hydrophilic layer for use in accordance with the present invention in order to get an improved adhesion between these two layers.

A preferred subbing layer for use in connection with the present invention, is a subbing layer contiguous to the hydrophilic layer characterized in that said subbing layer contains a hydrophilic binder and silica.

As hydrophilic binder in said subbing layer usually a protein, preferably gelatin may be used. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

A preferred silica in said subbing layer is a siliciumdioxide of the anionic type. The colloidal silica preferably has a surface area of at least 300 $m^2$ per gram, more preferably a surface area of 500 $m^2$ per gram.

The surface area of the colloidal silica is determined according to the BET-value method described by S. Brunauer, P. H. Emmett and E. Teller, J. Amer. Chem. Soc. 60, 309–312 (1938).

The silica dispersion may also contains other substances, e.g. aluminium salts, stabilising agents,biocides etc.

Such types of silica are sold under the name KIESELSOL 300 and KIESELSOL 500 (KIESELSOL is a registered trade name of Farbenfabriken Bayer AG, Leverkusen, West-Germany whereby the number indicates the surface area in $m^2$ per gram).

The weight ratio of the hydrophilic binder to silica in the subbing layer is preferably less than 1. The lower limit is not very important but is preferably at least 0.2. The weight ratio of the hydrophilic binder to silica is more preferably between 0.25 and 0.5.

The coverage of said subbing layer is preferably more than 200 mg per $m^2$ but less than 750 mg per $m^2$, more preferably between 250 mg per $m^2$ and 500 mg per $m^2$.

The coating of the above defined subbing layer composition preferably proceeds from an aqueous colloidal dispersion optionally in the presence of a surface-active agent.

As hydrophilic binder in the hydrophilic layer in connection with the present invention preferentially hydrophilic synthetic polymers are used, for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the homopolymer or copolymer used is preferably the same as or higher than the hydrophilicity of polyvinyl acetate hydrolyzed to at least an extent of 60 percent by weight, more preferably 80 percent by weight. Most preferably polyvinyl alcohol is used in the hydrophilic layer in connection with the present invention.

In order to obtain the hardened hydrophilic layer the hydrophilic synthetic polymers are hardened with hydrolyzed tetraalkyl orthosilicates.

Examples of hydrolyzed tetraalkyl orthosilicate crosslinking agents are hydrolyzed tetraethyl orthosilicate and hydrolyzed tetramethyl orthosilicate. The amount of tetraalkyl orthosilicate crosslinking agent is preferably at least 0.2 parts by weight per part by weight of hydrophilic (co)polymer, more preferably between 0.5 and 5 parts by weight, most preferably 1.5 part by weight.

The hydrophilic layer preferably also contains substances that increase the mechanical strength and the porosity of the layer. For this purpose colloidal silica may be used. The colloidal silica employed may be in the form of any commercially available water-dispersion of colloidal silica for example having an average particle size upto 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the layer is given a uniform rough texture consisting of microscopic hills and valleys, which serve as storage places for water in background areas.

More details about suitable hydrophilic layers for use in connection with the present invention can be found in e.g. GB-P-1419512, FR-P-2300354, U.S. Pat. Nos. 3,971,660, 4,284,705, EP-A-405016, EP-A-450199 and U.S. Ser. No. 07/881,718.

The physical development nuclei containing receiving layer of the lithographic receiving element used in accordance with the present invention is preferably free of hydrophilic binder but may comprise small amounts upto 30% by weight of the total weight of said layer of a hydrophilic colloid e.g. polyvinyl alcohol to improve the hydrophilicity of the layer. The physical development nuclei can be partially included in the hardened hydrophilic layer. Preferred development nuclei for use in accordance with the present invention are sulphides of heavy metals e.g. sulphides of antimony, bismuth, cadmium, cobalt, lead, nickel, palladium, platinum, silver, and zinc. More preferred development nuclei for use in accordance with the present invention are such sulphides having an average diameter less than 6 nm and wherein the number of nuclei having a diameter larger than 4.5 nm is less than 15% of the total number of nuclei contained in said receiving layer as disclosed in U.S. Ser. No. 07/979,897. Especially preferred development nuclei in connection with the present invention are palladium sulphide nuclei having an average diameter less than 6 nm and wherein the number of nuclei having a diameter larger than 4.5 nm is less than 15% of the total number of nuclei contained in said receiving layer. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The hardened hydrophilic layer and/or the receiving layer may incorporate at least one antihalation dye or pigment to promote the image sharpness. The usual dyes and pigments can be chosen depending upon the desired absorption spectrum of the silver halide emulsion layer(s) used.

The intermediate layer used in accordance with the present invention facilitates the removal of the photosensitive layer, thereby exposing said silver image formed in said receiving layer.

In one embodiment, the intermediate layer can be a water-swellable intermediate layer coated at a ratio of 0.01 to 2.0 g/m2 and comprising at least one non-proteinic hydrophilic film-forming polymer and optionally comprising an antihalation dye or pigment.

The non-proteinic hydrophilic film-forming polymer has to be chosen from the group of film-forming polymers that are soluble in aqueous medium and thus soften and swell by absorption of water. Suitable polymers are e.g. polyvinyl alcohol, polyvinyl pyrrolidone, polyethylene oxide, partly hydrolyzed polyvinyl acetate, sulphonated polystyrene, hydroxyethyl cellulose, carboxymethyl cellulose, cellulose acetate hydrogen phthalate, dextran, dextrins or derivatives thereof, starch, gum arabic, and alginic acid derivatives such as salts or esters thereof. It is also possible to use mixtures of two or more different non-proteinic hydrophilic film-forming polymers. Preference is given, however, to at least one polyvinyl alcohol having a molecular weight not higher than 15,000. The ratio of alcohol and acetate units in the polyvinyl alcohol does not seem to play an important role. Further details are disclosed in EP-A-410500.

In another embodiment, the intermediate layer can be a layer comprising hydrophobic polymer beads having an average diameter not lower than 0.2 μm and having been prepared by polymerization of at least one ethylenically unsaturated monomer e.g. chosen from the group consisting of alkyl methacrylates e.g. methyl methacrylate, ethyl methacrylate, propyl methacrylate, butyl methacrylate and the higher methacrylates such as stearyl methacrylate, substituted alkyl methacrylates e.g. hydroxyethyl methacrylate, alkyl acrylates, substituted alkyl acrylates, styrene, substituted styrene e.g. chlorostyrene, vinyltoluene and substituted vinyltoluene e.g. vinylbenzyl chloride and the homologues thereof, butadiene, substituted butadiene e.g. chlorobutadiene, 2-methylbutadiene, isobutylene, and substituted isobutylene, and vinylpyridine e.g. 2- and 4-vinyl-pyridine, said intermediate layer preferably comprising an antihalation dye or pigment. Preferably, said intermediate layer in dry condition comprises said hydrophobic polymer beads in an amount of up to 80% of its total weight.

According to a special embodiment of the present invention the intermediate layer may in addition to the hydrophobic polymer beads prepared by polymerization of at least one ethylenically unsaturated monomer also comprise an aqueous dispersion of alkali-soluble hydrophobic polymer particles, all particles having an average particle size not lower than 0.2 μm. The amount of said aqueous dispersion of hydrophobic polymer particles present in said intermediate layer may be up to 10% by weight calculated on the total weight of said layer. Further details are disclosed in EP-A-483415.

The photosensitive layer used in accordance with the present invention can consist of any silver halide emulsion comprising a hydrophilic colloid binder, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

According to the present invention the emulsion or emulsions preferably consist principally of silver chloride while a fraction of silver bromide may be present ranging from 1 mole % to 40 mole %. The emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated. Most preferably a silver halide emulsion containing at least 70 mole % of silver chloride is used.

Surface image emulsions may be used or internal image emulsions may be used such as those described in U.S. Pat. Nos. 2,592,250, 3,206,313, and 3,447,927. Two or more types of silver halide emulsions that have been prepared differently can be mixed for forming a photographic emulsion layer for use in accordance with the present invention The average size of the silver halide grains may range from 0.10 to 0.70 μm, preferably from 0.25 to 0.45 μm.

The size distribution of the silver halide particles of the photographic emulsions to be used according to the present invention. can be homodisperse or heterodisperse. A homodisperse size distribution is obtained when 95% of the grains have a size that does not deviate more than 30% from the average grain size.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$. This results in the building in in the silver halide crystal lattice of minor amounts of iridium and/or rhodium, so-called iridium and/or rhodium dopants. As known to those skilled in the art numerous scientific and patent publications disclose the addition of iridium or rhodium containing compounds or compounds containing other elements of Group VIII of the Periodic System during emulsion preparation.

Apart from negative-working silver halide emulsions that are preferred for their high photosensitivity, use can be made also of direct-positive silver halide emulsions that produce a positive silver image in the emulsion layer(s) and a negative image on the lithographic receiving layer.

For instance, direct-positive emulsions of the type described in U.S. Pat. No. 3,062,651 may be employed. In direct-positive emulsions a non-hardening fogging agent such as stannous chloride and formamidine sulphinic acid can be used.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The,emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

The spectral photosensitivity of the silver halide can also be adjusted for exposure by laser light e.g. helium-neon laser light, argon laser light, and solid state laser light. Dyes that can be used for adjusting the photosensitivity to laser light have been described in i.a. JN-62284344, 62284345, 62141561, 62103649, 62139555, 62105147, 62105148, 62075638, 62062353, 62062354, 62062355, 62157027, 62157028, 62113148, 61203446, 62003250, 60061752, 55070834, 51115821, 51115822, 51106422, 51106423, 51106425; DE-A-3,826,700; U.S. Pat. Nos. 4,501,811, 4,725,532, 4,784,933; GB-P-1,467,638; and EP-A-100,654 and in documents cited therein.

The spectral sensitizers can be added to the photographic emulsions in the form of an aqueous solution, a solution in an organic solvent or in the form of a dispersion.

The silver halide emulsions may contain the usual stabilizers e.g. homopolar or salt-like compounds of mercury with aromatic or heterocyclic rings such as mercaptotriazoles, simple mercury salts, sulphoniummercury double salts and other mercury compounds. Other suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole,, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787, DE-P-2,453,217.

In an especially preferred embodiment the emulsion layer contains a compound which comprises in its molecular structure a group capable of adsorbing to silver halide and a group capable of reducing silver halide. Compounds of this kind have been disclosed in EP-A-449340. In this way a combination of a stabilizing and a development activating function in one compound is achieved.

More details about the composition, preparation and coating of silver halide emulsions can be found in e.g. Product Licensing Index, Vol. 92, December 1971, publication 9232, p. 107–109.

As an interesting variant the silver halide emulsion may consist of a first photosensitive direct-positive or negative silver halide emulsion in which a normal latent image is formed upon image-wise exposure and a second low-speed silver halide emulsion whose speed is so low that no or almost no latent image is formed therein. When the low-speed silver halide emulsion and the photosensitive silver halide emulsion are coated to form different layers, the resulting emulsion layers are arranged in such a way that the low-speed emulsion is remotest from the lithographic receiving element. It is also possible to coat one single layer comprising a mixture of said photosensitive silver halide emulsion and said low-speed silver halide emulsion.

Thanks to the combination of photosensitive and low-speed emulsions a higher amount of silver can migrate to form the silver image on the physical development nuclei containing layer. As a result, an enhanced contrast and a high resistance against mechanical wear are obtained.

The low-speed silver halide emulsion has a speed which is so low, that substantially no visible image is formed therein under the conditions of exposure and development of the photosensitive silver halide emulsion layer. In as much as the sensitivity of this emulsion must be low, no physical or chemical sensitization thereof is needed. The low-speed emulsion may be a pure silver chloride emulsion or an emulsion of mixed silver halides comprising silver chloride e.g. a silver chlorobromide or chlorobromoiodide emulsion. However, the low-speed emulsion preferably is a fine-grain silver chloride emulsion having a particle size in the range of 50 to 500 nm.

In case a mixture of low-speed emulsion and of imaging emulsion is coated to form one single layer, the amount of low-speed emulsion may vary within wide limits. Favourable results can be obtained when the ratio of low-speed silver chloride-containing emulsion to image-forming emulsion, expressed in parts by weight of silver nitrate, ranges from 10:1 to 1:1.

When separate layers of low-speed emulsion and of imaging emulsion are used, the ratio expressed in parts by weight of silver nitrate of said different layers, also ranges from 10:1 to 1:1.

A supplemental intermediate layer, which may be present between said silver halide emulsion containing layer and said water-swellable intermediate layer or said intermediate layer comprising hydrophobic polymer beads may incorporate one or more ingredients such as i.a. antihalation dyes or pigment, developing agents, silver halide solvents, base precursors, and anticorrosion substances.

A wide choice of cameras for exposing the photosensitive silver halide emulsion exists on the market. Horizontal, vertical and darkroom type cameras and contact-exposure apparatus are available to suit any particular class of reprographic work. The photosensitive silver halide emulsion(s) used in the layer assemblages according to the present invention can also be exposed with the aid of i.a. laser recorders and cathode rays tubes.

The exposure is normally made through the emulsion but can also be made through the back. To obtain a sharp image by exposing through the back, the haze and the minimum density of the hardened hydrophilic layer on a flexible hydrophobic support should be sufficiently low. Haze has been described in the book "Dictionary of Scientific and Technical Terms" –4° Edition—Mc Graw-Hill—New York, (1981) as the degree of cloudiness in a solution, cured plastic material or coating material. The value of haze in percent for a coating material has been calculated from the following formula:

$$\text{Haze}(\%)=100.T_e/T_t=100.(T_t-T_s)/T_t$$

with $T_t$=Total or Mixed Transmission;

$T_s$=Specular Transmission;

$T_e$=Total Transmission minus Specular Transmission.

In a material suitable for exposure through the back the hardened hydrophilic layer on a flexible hydrophobic support should have a haze value of less than 80%. More preferably the haze value should be less than 50% and most preferably less than 30%. The minimum density should be less than 0.3 and more preferably less than 0.1.

The development and diffusion transfer are effected with the aid of an aqueous alkaline solution in the presence of (a) developing agent(s) and (a) silver halide solvent(s). The developing agent(s) and/or the silver halide solvent(s) can be incorporated in the aqueous alkaline solution and/or in said silver halide emulsion layer and/or in any of said intermediate layers and/or in a supplemental hydrophilic colloid layer in water-permeable relationship with said silver halide emulsion layer. The latter supplemental hydrophilic colloid layer can be coated on top of said silver halide emulsion layer remotest from said hydrophilic layer.

The silver halide solvent can also be incorporated at least in part in the physical development nuclei containing layer. When the aqueous alkaline solution does not comprise the developing agent(s), it is merely an activating liquid that is capable of dissolving the developing agent(s) contained in one of the layers.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. Preferred phenidone type developing agents, particularly when they are incorporated into the photographic material are phenidones of which the aqueous solubility is increased by a hydrophilic substituent such as e.g. hydroxy, amino, carboxylic acid group, sulphonic acid group etc. Examples of phenidones subsituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used. Preferred amounts of the hydroquinone-type developing agents-are in the range of 0.05 mole to 0.25 mole per liter and preferred amounts of secondary developing agent(s) in the range of $1.8\times10^{-3}$ to $2.0\times10^{-}$mole per liter.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are alkanolamines. Alkanolamines that are suitable for use in accordance with the present invention may be of the tertiary, secundary or primary type. Examples of alkanolamines that may be used in connection with the present invention correspond to the following formula:

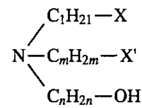

wherein X and X' independently represent hydrogen, a hydroxyl group or an amino group, 1 and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

According to the present invention the alkanolamines are preferably present in the alkaline processing-liquid in a concentration preferably between 0.05% and 10% by weight. However part or all of the alkanolamine can be present in one or more layers of the imaging element.

Further suitable silver halide solvents are thioethers. Preferably used thioethers correspond to the following general formula:

$$Z—(R^1—S)_t—R^2—S—R^3—Y$$

wherein Z and Y each independently represents hydrogen, an alkyl group, an amino group, an ammonium group, a hydroxyl, a sulfo group, a carboxyl, an aminocarbonyl or an aminosulfonyl ,$R^1$ $R^2$ and $R^3$ each independently represents an alkylene that may be substituted and optionally contain a oxygen bridge and t represents an integer from 0 to 10 as disclosed in U.S. Pat. No. 5,200,294. Examples of thioether compounds corresponding to the above formula are disclosed in e.g. U.S. Pat. Nos. 4,960,683 and 5,200,294.

Still further suitable silver halide solvents are meso-ionic compounds as disclosed in U.S. Ser. No. 07/986,071. Preferred meso-ionic compounds for use in accordance with the present invention are triazoliumthiolates and more preferably 1,2,4-triazolium-3-thiolates and most preferably those that correspond to the following formula:

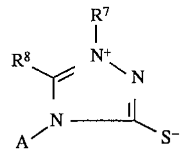

wherein $R^7$ and $R^8$ each independently represents a substituted or unsubstituted alkyl group, a substituted or unsubstituted alkenyl group, a substituted or unsubstituted cycloalkyl group, a substituted or unsubstituted aralkyl group, a substituted or unsubstituted aryl group or a substituted or unsubstituted heterocyclic group, A represents a substituted or unsubstituted alkyl group, a substituted or unsubstituted alkenyl group, a substituted or unsubstituted cycloalkyl group, a substituted or unsubstituted aralkyl group, a substituted or unsubstituted aryl group, a substituted or unsubstituted heterocyclic group or —$NR^9R^{10}$ and $R^9$ and $R^{10}$ each independently represents hydrogen, a substituted or unsubstituted alkyl group, a substituted or unsubstituted aryl group or $R^7$ and $R^8$ or $R^8$ and A or $R^9$ and $R^{10}$ represent the necessary atoms to form together with the atoms to which they are attached a 5- or 6-membered ring.

According to the preferred embodiment of the present invention at least part and most preferably all of the meso-ionic compound is preferably present in the alkaline processing liquid used for developing the image-wise exposed imaging element. Preferably the amount of meso-ionic compound in the alkaline processing liquid is between 0.1 mmol/l and 50 mmol/l and more preferably between 0.1 mmol/l and 25 mmol/l and most preferably between 0.5 mmol/l and 10 mmol/l.

However the meso-ionic compound may be incorporated in one or more layers comprised on the flexible support of the imaging element. This offers the advantage of replenishment of said meso-ionic compound in the alkaline processing liquid. Preferably the meso-ionic compound is incorporated in a layer of the imaging element that does not contain silver halide such as e.g. in a backing layer, in the image receiving layer, a subbing layer etc. The meso-ionic compound is preferably contained in the imaging element in a total amount between 0.1 and 10mmol/$m^2$, more preferably between 0.1 and 5 mmol/$m^2$ and most preferably between 0.5 and 1.5mmol/$m^2$.

Still further suitable silver halide solvents are sulphite, amines 2-mercaptobenzoic acid and those disclosed in "The Theory of the Photographic Process" 4th Ed., edited by T. H. James, pages 474–475. Further interesting silver halide solvents have been described in i.a. U.S. Pat. Nos. 2,857, 276, 4,355,090, 4,297,429 and 4,297,430. Among these are cyclic imide compounds such as e.g. uracil and 5,5-dialkylhydantoins. Other suitable silver halide solvents are the alkyl sulfones.

Combinations of different silver halide solvents can be used and it is also possible to incorporate at least one silver halide solvent into a suitable layer and add at least one other silver halide solvent to the developing solution.

Suitable combinations of different silver halide solvents are a combination of (an) alkanolamine(s) and a thiosulfate wherein-said thiosulfate is used in a total amount between 0.01% and 1% by weight in said alkaline processing liquid as disclosed in U.S. Ser. No. 07/810,151 and 4,6-dihydroxypyrimidines in combination with other silver halide solvents, especially with alkanolamines as disclosed in U.S. Ser. No. 07/810,146.

The aqueous alkaline solution in accordance with the present invention may-further comprise sulphite e.g. sodium sulphite in an amount ranging from 40 g to 180 g per liter, preferably from 60 to 160 g per liter, and a silver halide solvent, preferably a water soluble thiosulphate and/or thiocyanate in an amount ranging from 5 g to 20 g per liter.

Other suitable combinations of different silver halide solvents are combinations of a meso-ionic compound and another silver halide solvent. Preferably the other silver halide solvent is used in an amount between 0.05% by weight and 10% by weight and more preferably between 0.05% by weight and 7% by weight.

Good results are obtained when a meso-ionic compound, preferably a triazolium thiolate, is used in combination with a thioether as silver halide solvent. Even better results are obtained when a combination of a meso-ionic compound, a thioether and/or an alkanolamine are used as silver halide solvents. Combinations of at least one silver halide solvent and a regulator may also be used. Suitable regulators are disclosed in U.S. Ser. No. 07/986,072 and in EP-A-92201997.1.

The aqueous alkaline solution in accordance with the present invention preferably comprise aluminium ions in an amount of at least 0.3 g/l in order to prevent sticking of the emulsion layer to the transporting rollers when the emulsion is swollen with the aqueous alkaline solution. More preferably the aqueous alkaline solution in accordance with the present invention comprise aluminium ions in an amount of at least 0.6 g/l.

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

According to a preferred embodiment described in Research Disclosure 27939 (July 1987) pages 450–451 the aqeuous alkaline solution comprises at least one tertiary alkanolamine having a pKa value higher than 8.5. More preferably, the solution comprises two or more tertiary alkanolamines having a pKa value higher than 9.0.

The pH of the aqueous alkaline solution depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The aqueous alkaline solution may further comprise hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. Nos. 3,776,728, and 4,563,410. Particularly preferred hydrophobizing agents in connection with the present invention are long chain (at least 5 carbon atoms) alkyl substituted mercaptotetrazoles, more in particular those according to the following formula:

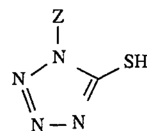

wherein Z represents a substituted or unsubstituted alkyl, a substituted or unsubstituted aryl, a substituted or unsubstituted aralkyl, a substituted or unsubstituted alkylaryl, a substituted or unsubstituted alkenyl, a substituted or unsubstituted alkynyl or a heterocyclic ring.

Specific examples of hydrophobizing agents according to the above formula are listed in table1.

TABLE 1

| compound no. | Z |
|---|---|
| 1 | $CH_2CONH\text{-n.}C_6H_{13}$ |
| 2 | $CH_2CON(n.C_4H_9)_2$ |
| 3 | $C_6H_{13}$ |

The hydrophobizing agents can be used alone or in combination with each other. According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not. The development may be stopped—though this is often not necessary—with a so-called stabilization liquid, which actually is an acidic stop-bath having a pH preferably in the range of 5 to 6.

Bufferred stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C.

After formation of the silver image on the lithographic receiving element an excess of alkaline solution still present on the monosheet layer assemblage may be eliminated, preferably by guiding the monosheet layer assemblage through a pair of squeezing rollers.

The silver image, thus obtained in the receiving layer is subsequently exposed by washing the imaging element to remove the photosensitive layer and the intermediate layer.

According to one embodiment for removing the photosensitive layer and the intermediate layer the imaging element is treated with rinsing water or an rinsing aqueous medium.

According to a preferred embodiment for removing the photosensitive layer and the intermediate layer the imaging element is slightly agitated while being dipped in rinsing water or rinsing aqueous medium or by slightly agitating a tray comprising rinsing water or rinsing aqueous medium in which said developed imaging element has been immersed.

According to a more preferred embodiment for removing the photosensitive layer and the intermediate layer the imaging element is held under a spray or jet of rinsing water or rinsing aqueous medium. The mechanical pressure of a water jet or spray directed onto these layers suffices to detach them from the receiving layer. The rinsing aqueous medium used to detach the intermediate layer and the emulsion layer(s) by rinsing may comprise ingredients such as i.a. weak acidifying agents, wetting agents, and hardeners including latent hardeners.

The temperature of the rinsing water may be varied widely but is preferably between 20° C. and 30° C.

The imaged surface of the hydrophilic lithographic base can be subjected to a chemical treatment that increases the hydrophilicity of the non-silver image parts and the oleophilicity of the silver image.

This chemical after-treatment is preferably carried out with a lithographic composition often called fixer, which comprises at least one compound enhancing the ink-receptivity and/or lacquer-receptivity of the silver image, and also comprises at least one compound that improves the ink-repelling characteristics of the hydrophilic lithographic base.

Suitable ingredients for the fixer are e.g. organic compounds containing a mercapto group such as the hydrophobizing compounds referred to hereinbefore for the alkaline solution and dodecylmercaptans, benzothiazole-2-thiol, 1,3,4-thiadiazole-2-thiol, 1-phenyl-1-H-tetrazole-5-thiol, triazinethiols e.g. 1-octyl-1,2,4,5-tetrahydro-S-triazine-5-thiol Additives improving the oleophilic ink-repellency of the bare hydrophilic lithographic base areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, and polyvinyl alcohol. Optionally, hygroscopic substances e.g. sorbitol, glycerol, tri(hydroxyethyl)ester of glycerol, meso-ionic thiolate compounds as disclosed in U.S. Ser. No. 07/986071 and turkey red oil may be added. Furthermore, phosphoric acid and cationic surface-active compounds such as hexadecyl trimethyl ammonium bromide can also be added to the fixer. Still further compounds improving the stability of the printing plate presumably by forming a protective layer such as polyalkylene oxide derivatives preferably polyethylene oxides with a molecular weight of 2,000 to 10,000 and most preferably with a molecular weight of 3,000 to 5,000 can also be added to the fixer. A suitable fixer is e.g. a composition comprising a solution of 1-octyl-1,2,4,5-tetrahydro-S-triazine-5-thiol in acetone or a suspension thereof in a solution of gum arabic. Another suitable fixer as disclosed in U.S. Pat. No. 4,563,410 is a composition comprising a solution of a mercaptotriazole in a solution of polyethylene oxide with a molecular weight of 4,000. Further suitable fixers have been described in i.a. U.S. Pat. No. 4,062,682.

At the moment the treatment with the fixer is started the surface carrying the silver pattern may be in dry or wet state. In general, the treatment with the fixer does not take long, usually not longer than about 30 seconds and it may be carried out immediately after the processing and uncovering steps.

The fixer can be applied in different ways such as by rubbing with a roller, by wiping with an absorbent means e.g. with a plug of cotton or sponge, or by dipping the material to be treated in the fixer. The image-hydrophobizing step of the printing plate may also proceed automatically by conducting the printing plate through a device having a narrow channel filled with the fixer and conveying the printing plate at the end of the channel between two squeezing rollers removing the excess of liquid.

The following example illustrates the present invention without however, limiting it thereto. All parts, percentages and ratios are by weight unless otherwise indicated.

EXAMPLE 1

Preparation of the hydrophilic layer coating solution.

To 440 g of a dispersion containing 2.1% $SiO_2$ (average particle size 7 nm) and 2.5% polyvinyl alcohol in deionized water were subsequently added, while stirring, 250 g of a 5% polyvinyl alcohol solution in water, 105 g of a hydrolyzed 22% tetramethyl orthosilicate emulsion in water and 22 g of a 10% solution of a wetting agent. To this mixture was then added 183 g of deionized water and the pH was adjusted to pH=4.

Preparation of the silver halide emulsion coating solution.

A silver chlorobromide emulsion composed of 98.2 mole % of chloride and 1.8 mole % of bromide was prepared by the double jet precipitation method. The average silver halide grain size was 0.4 μm (diameter of a sphere with equivalent volume) and contained Rhodium ions as internal dopant. The emulsion was orthochromatically sensitized and stabilized by 1-phenyl-5-mercapto-tetrazole.

Preparation of the imaging element.

The hydrophilic coating solution was coated to a polyethylene terephthalate support provided with a hydrophilic subbing layer. such that the $SiO_2$ coverage was 0.84 $g/m^2$ and the polyvinyl alcohol content was 1 $g/m^2$.

The thus obtained element was dried and subjected to a temperature of 40° C. for 5 days and then the hydrophilic layer was overcoated with a layer containing PdS as physical development nuclei and then with the emulsion layer such that the silver halide coverage expressed as $AgNO_3$ was 2.5 $g/m^2$ and the gelatin content was 1.7 $g/m^2$.

The monosheet photosensitive element was exposed through a contact screen in a process-camera and immersed for 8 s at 25° C. in a freshly made developing solution having the following ingredients:

| | |
|---|---|
| carboxymethylcellulose | 18 g |
| sodium hydroxide | 22.5 g |
| anhydrous sodium sulphite | 120 g |
| hydroquinone | 20 g |
| 1-phenyl-3-pyrazolidinone | 3 g |
| potassium bromide | 0.75 g |
| anhydrous sodium thiosulphate | 7.5 g |
| ethylene diamine tetraacetic acid tetrasodium salt | 2 g |
| demineralized water to make | 1000 ml |
| pH (25° C.) = 13 | |

The initiated diffusion transfer was allowed to continue for 30 s to form a silver image in the receiving layer.

To remove the developed silver halide emulsion layer from the imaged hydrophilic layer, the developed imaging element was rinsed for 30 s with a water jet.

Next, the imaged surface of the hydrophilic layer was treated with a fixer to enhance the water-receptivity of the non-image areas and to make the image areas oleophilic ink-receptive. The fixer had the following composition:

| | |
|---|---|
| 10% aqueous n-hexadecyl trimethyl ammonium chloride | 25 ml |

-continued

| | |
|---|---|
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| sodium hydroxide | 5.5 g |
| water to make | 1000 ml |
| pH (20° C.) = 4 | |

The printing plate thus prepared was mounted on an offset printing machine (Heidelberg GTO-46) and was printed. A commercial dampening solution AQUA TAME was used at a 5% concentration for fountain solution, and K+E 125 as ink. A compressible rubber blanket was used.

The printing plate is easily visually inspected. A run of 5,000 copies was made, all of good quality. The dampening solution and the ink are commercial products which are also used for other types of printing plates

We claim:

1. An imaging element comprising on a flexible hydrophobic support in the order given (i) a subbing layer containing a hydrophilic binder and silica in an amount between 200 mg/m$^2$ and 750 mg/m$^2$, (ii) a hardened hydrophilic layer, contiguous to said subbing layer and containing a hydrophilic synthetic homopolymer or copolymer and being hardened with a hydrolyzed tetraalkyl orthosilicate crosslinking agent, (iii) a receiving layer containing physical development nuclei contiguous to said hydrophilic layer, (iv) an intermediate layer comprising a non-proteinic hydrophilic film-forming polymer or hydrophobic polymer beads having an average diameter not lower than 0.2 μm and having been prepared by polymerization of an ethylenically unsaturated monomer and (v) a photosensitive layer containing a silver halide emulsion being in water permeable relationship with said receiving layer.

2. An imaging element according to claim 1 wherein the hydrophilicity of the said hydrophilic synthetic polymers is the same as or higher than the hydrophilicity of polyvinyl acetate hydrolyzed to at least an extent of 60 percent by weight.

3. An imaging element according to claim 2, wherein said hydrophilic synthetic polymers are polyvinyl alcohol.

4. An imaging element according to claim 1, wherein said hydrolyzed tetraalkyl orthosilicate crosslinking agents are hydrolyzed tetraethyl orthosilicate and/or hydrolyzed tetramethyl orthosilicate.

5. A method for making a lithographic printing plate according to the silver salt diffusion transfer process comprising the steps of:

(a) image-wise exposing an imaging element comprising on a flexible hydrophobic support in the order given (i) a subbing layer containing a hydrophilic binder and silica in an amount between 200 mg/m$^2$ and 750 mg/m$^2$, (ii) a hardened hydrophilic layer, contiguous to said subbing layer and containing a hydrophilic synthetic homopolymer or copolymer and being hardened with a hydrolyzed tetraalkyl orthosilicate crosslinking agent, (iii) a receiving layer containing physical development nuclei contiguous to said hydrophilic layer, (iv) an intermediate layer comprising a non-proteinic hydrophilic film-forming polymer or hydrophobic polymer beads having an average diameter not lower than 0.2 μm and having been prepared by polymerization of an ethylenically unsaturated monomer and (v) a photosensitive layer containing a silver halide emulsion being in water permeable relationship with said receiving layer, (b) applying an aqueous alkaline solution to the imaging element in the presence of (a) developing agent(s) and (a) silver halide solvent(s) to form a silver image and to allow unreduced silver halide or complexes formed thereof to diffuse image-wise from the photosensitive layer to said receiving layer to produce therein a silver image, and (c) washing the imaging element to remove the photosensitive layer, thereby exposing said silver image formed in said receiving layer.

6. A method according to claim 5 wherein said imaged surface obtained after washing the imaging element, is treated with a fixer to enhance the water-receptivity of the non-image areas and to make the image areas oleophilic ink-receptive.

7. A method according to claim 5 wherein the hydrophilicity of the said hydrophilic synthetic polymers is the same as or higher than the hydrophilicity of polyvinyl acetate hydrolyzed to at least an extent of 60 percent by weight.

8. A method according to claim 7, wherein said hydrophilic synthetic polymers are polyvinyl alcohol.

9. A method according to any of claims 5 to 8 wherein said imaging element is exposed through the back, said hardened hydrophilic layer on a transparent flexible hydrophobic support having a haze value of less than 80% and a minimum density of less than 0.3.

* * * * *